US010038420B2

(12) United States Patent
Ishizuka

(10) Patent No.: US 10,038,420 B2
(45) Date of Patent: *Jul. 31, 2018

(54) TRANSFORMER AND WIRELESS COMMUNICATION APPARATUS

(71) Applicant: Murata Manufacturing Co., Ltd., Nagaokakyo-shi, Kyoto-fu (JP)

(72) Inventor: Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/299,877

(22) Filed: Oct. 21, 2016

(65) Prior Publication Data

US 2017/0040967 A1    Feb. 9, 2017

Related U.S. Application Data

(63) Continuation of application No. 14/641,575, filed on Mar. 9, 2015, now Pat. No. 9,515,632, which is a (Continued)

(30) Foreign Application Priority Data

Sep. 28, 2012  (JP) ................. 2012-217709
Dec. 14, 2012  (JP) ................. 2012-273421
Apr. 16, 2013  (JP) ................. 2013-085548

(51) Int. Cl.
*H03H 7/38* (2006.01)
*H01F 27/38* (2006.01)
(Continued)

(52) U.S. Cl.
CPC ............ *H03H 7/38* (2013.01); *H01F 19/04* (2013.01); *H01F 27/2804* (2013.01);
(Continued)

(58) Field of Classification Search
CPC ............ H03H 7/38; H01Q 5/50; H01F 19/04
(Continued)

(56) References Cited

U.S. PATENT DOCUMENTS

| 5,521,573 | A | * | 5/1996 | Inoh | ................. | H01F 27/2804 |
| | | | | | | 336/180 |
| 2002/0057171 | A1 | * | 5/2002 | Patel | ................. | H01F 27/2804 |
| | | | | | | 336/200 |
| 2010/0019858 | A1 | * | 1/2010 | McMorrow | ........... | H03F 1/56 |
| | | | | | | 333/32 |

OTHER PUBLICATIONS

Ishizuka, "Impedance Transformation Circuit and Wireless Communication Apparatus", U.S. Appl. No. 14/641,575, filed Mar. 9, 2015.

* cited by examiner

*Primary Examiner* — Stephen E Jones
*Assistant Examiner* — Scott S Outten
(74) *Attorney, Agent, or Firm* — Keating & Bennett, LLP

(57) ABSTRACT

A first coil element includes a first loop-shaped conductor and a second loop-shaped conductor. A second coil element includes a third loop-shaped conductor and a fourth loop-shaped conductor. The first loop-shaped conductor and the second loop-shaped conductor are sandwiched in a stacking direction between the third loop-shaped conductor and the fourth loop-shaped conductor. A conductive pattern which is a portion of the first loop-shaped conductor and a conductive pattern which is a portion of the second loop-shaped conductor are connected in parallel. Then, each of a conductive pattern which is a remaining portion of the first loop-shaped conductor and a conductive pattern which is a remaining portion of the second loop-shaped conductor is connected in series with the parallel circuit.

12 Claims, 25 Drawing Sheets

Related U.S. Application Data continuation of application No. PCT/JP2013/074476, filed on Sep. 11, 2013.

(51) Int. Cl.
| | | |
|---|---|---|
| *H01F 38/14* | (2006.01) | |
| *H03H 7/01* | (2006.01) | |
| *H01F 19/04* | (2006.01) | |
| *H01Q 5/50* | (2015.01) | |
| H01F 27/28 | (2006.01) | |
| H03H 1/00 | (2006.01) | |

(52) U.S. Cl.
CPC ............... *H01F 38/14* (2013.01); *H01Q 5/50* (2015.01); *H03H 7/0138* (2013.01); *H01F 2027/2809* (2013.01); *H03H 2001/0085* (2013.01)

(58) Field of Classification Search
USPC .......................................................... 333/32
See application file for complete search history.

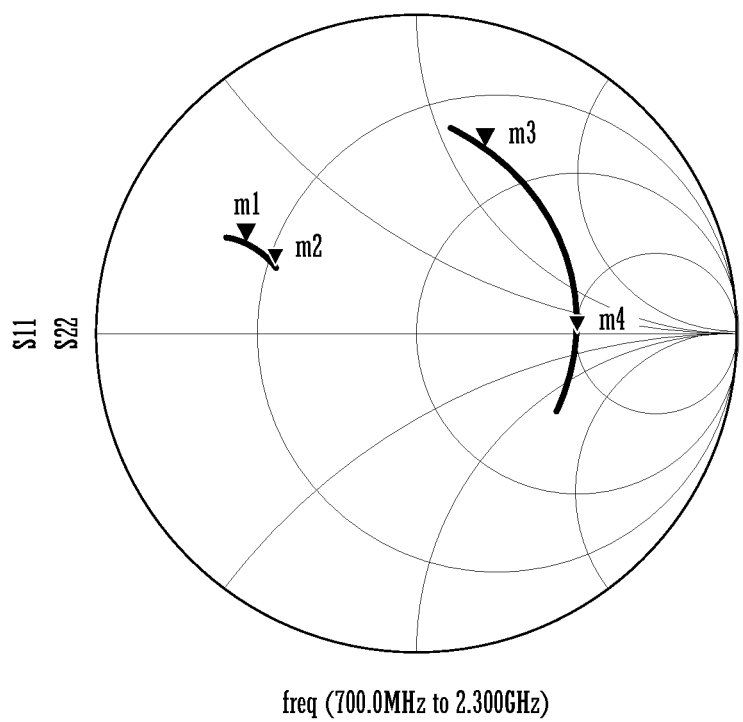

FIG.12A
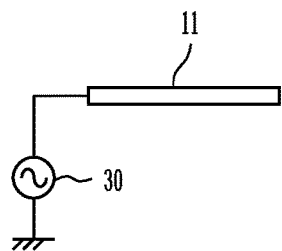
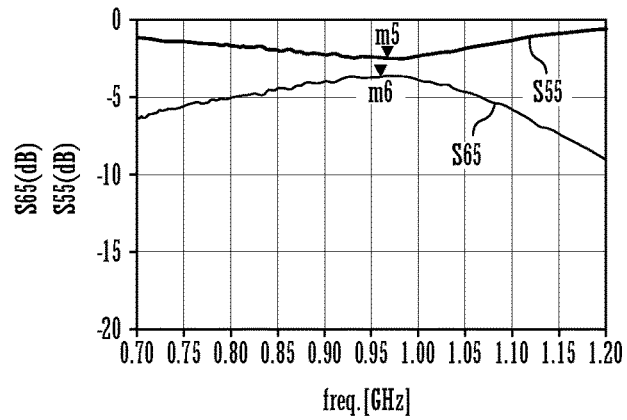
FIG.12B
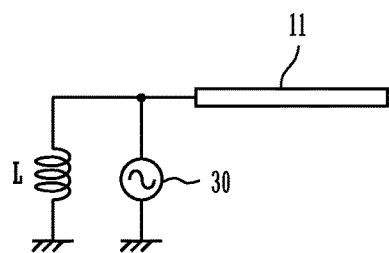
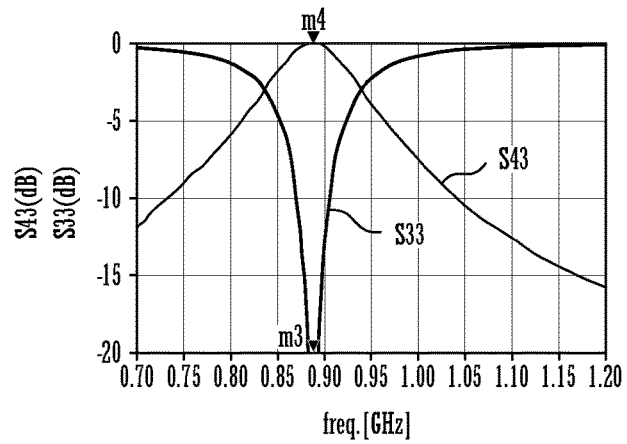
FIG.12C
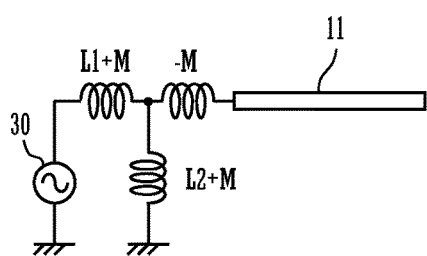
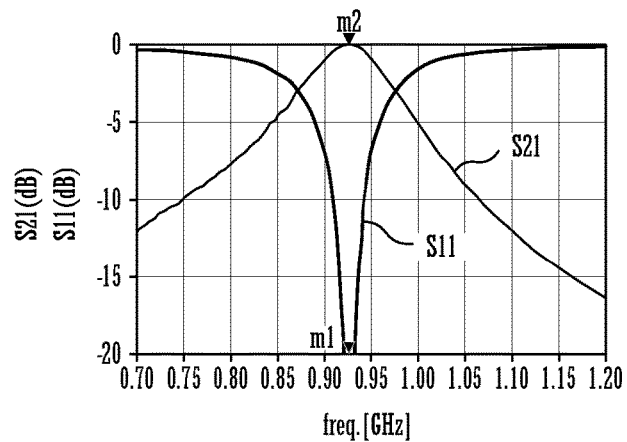

TRANSFORMER AND WIRELESS COMMUNICATION APPARATUS

BACKGROUND OF THE INVENTION

1. Field of the Invention

The present invention relates to an impedance transformation circuit and a wireless communication apparatus preferably for use in an antenna device or other suitable device.

2. Description of the Related Art

Frequency bands used in cellular phones in recent years are very broad bands, and for example, a penta-band-supported cellular terminal is required to support both of a Low Band (for example, 824 MHz to 960 MHz) and a High Band (for example, 1710 MHz to 2170 MHz). For this reason, in order to allow a single antenna to support both of the Low Band and the High Band, the antenna is assigned with different operation modes according to frequency ranges. In normal circumstances, the antenna is designed to support the Low Band in a fundamental wave mode, and is designed to support the High Band in a higher harmonic wave mode. Then, the input impedance of the antenna is different according to the modes (resonance point). Antennas for cellular phone terminals have, for example, impedance of about 8Ω in the Low Band and impedance of about 15Ω in the High Band.

A matching circuit based on a transformer is used to attain matching between a feeder circuit and an antenna having different input impedance according to frequency bands as described above. In this case, when a transformer ratio is constant, matching is attained at any one of the frequency ranges and then matching cannot be attained at the other of the frequency ranges. Therefore, a matching circuit having different impedance transformation ratios according to frequency bands becomes necessary. For example, Japanese Patent Unexamined Publication No. 2012-191596 describes an impedance matching circuit having frequency characteristics (frequency dependency) by giving a reactance element to an impedance transformation circuit based on a transformer.

By, the way, in a transformer having frequency characteristics which attains impedance matching in a desired range, the impedance at the antenna port side can be said to be equivalent to antenna impedance for each frequency. When the antenna port-side impedance of the transformer is matched to the impedance of the antenna in the Low Band and the High Band, and a coupling coefficient that could be attained with the actual structure is considered, combinations of an inductance L1 of a primary coil and an inductance L2 of a secondary coil used for coupling are limited to two combinations. Then, the values of L1 and L2 are very small, e.g., several nH, and a structure becomes difficult to obtain a high coupling coefficient because of the following factors.

When coils of about 2 nH are coupled, a sufficient number of turns of each coil cannot be secured (the magnetic flux is not concentrated).

The inductances at the input and the output of the transformer become large in an overall proportion and the effective value of the coupling coefficient becomes small.

In order to obtain a predetermined (large) coupling coefficient with a small coil, it is effective to configure the shapes of the primary coil and the secondary coil to be the same shape or substantially the same shape (i.e., a shape close to congruent) and arrange the primary coil and the secondary coil so as to overlap each other.

However, when the primary coil and the secondary coil have the same shape, it is very difficult to obtain a desired inductance value for each of the primary coil and the secondary coil.

SUMMARY OF THE INVENTION

Therefore, preferred embodiments of the present invention provide an impedance transformation circuit which is capable of obtaining a predetermined (large) coupling coefficient with a small coil and which obtains a predetermined impedance transformation ratio, and provide a wireless communication apparatus including the same.

An impedance transformation circuit according to a preferred embodiment of the present invention includes a first coil element and a second coil element coupled via a transformer and which are disposed in a stacked element that includes a plurality of base material layers stacked on each other, wherein the first coil element includes a first loop-shaped conductor and a second loop-shaped conductor disposed in different layers of the stacked element, respectively, the second coil element includes a third loop-shaped conductor and a fourth loop-shaped conductor disposed in different layers of the stacked element, respectively, the first loop-shaped conductor, the second loop-shaped conductor, the third loop-shaped conductor, and the fourth loop-shaped conductor have the same or substantially the same shape in a top view from a stacking direction (i.e., a pattern circulating in a same loop or substantially the same loop), the first loop-shaped conductor and the second loop-shaped conductor are sandwiched in the stacking direction between the third loop-shaped conductor and the fourth loop-shaped conductor, and at least portions of the first loop-shaped conductor and the second loop-shaped conductor are connected in parallel.

According to the above configuration, the first loop-shaped conductor and the second loop-shaped conductor are arranged adjacent to each other in the stacking direction, and therefore, the first coil element has a larger self-inductance than the second coil element. In addition, the at least portions of the first loop-shaped conductor and the second loop-shaped conductor are connected in parallel, so that even though the first coil element and the second coil element have the same or substantially the same shape, the first coil element and the second coil element have different inductance values. Further, the loop-shaped conductor of the first coil element and the loop-shaped conductor of the second coil element are in proximity to each other in the stacking direction and are coupled by a mutual inductance, and therefore, a sufficient coupling coefficient is obtained between the first coil element and the second coil element.

A parallel circuit preferably includes a portion of the first loop-shaped conductor and a portion or all of the second loop-shaped conductor, and each of a remaining portion of the first loop-shaped conductor and a remaining portion of the second loop-shaped conductor is preferably connected in series with the parallel circuit.

According to the above configuration, the remaining portions of the first loop-shaped conductor and the second loop-shaped conductor also contribute to the self-inductance of the first coil element and the mutual inductance with the second coil element, and therefore, a desired (large) coupling coefficient and a predetermined impedance transformation ratio are easily obtained even though the circuit is small.

A conductive pattern connected in series with one of the third loop-shaped conductor and the fourth loop-shaped conductor is preferably provided in a formation layer of one of the first loop-shaped conductor and the second loop-shaped conductor. According to this configuration, the number of turns and the inductance of the second coil element is increased, and the setting range of the impedance transformation ratios is expanded.

The third loop-shaped conductor and the fourth loop-shaped conductor are preferably connected in series. According to this configuration, the number of turns and the inductance of the first coil element is small, and the number of turns and the inductance of the second coil element are large, so that a large impedance transformation ratio is obtained.

Each of the first loop-shaped conductor, the second loop-shaped conductor, the third loop-shaped conductor, and the fourth loop-shaped conductor is preferably loop-shaped including substantially a single turn per layer. According to this configuration, the wire arrangement of the first to fourth loop-shaped conductors in the surface direction and the connection thereof in the stacking direction are simplified, so that the conductive pattern not contributing to the coupling is reduced, and the size of the circuit is easily reduced.

At least any of the first loop-shaped conductor, the second loop-shaped conductor, the third loop-shaped conductor, and the fourth loop-shaped conductor may define a loop including a plurality of turns over a plurality of base material layers. According to this configuration, desired inductances of the first coil element and the second coil element are obtained without increasing the area of a stacked body.

At least any of the first loop-shaped conductor, the second loop-shaped conductor, the third loop-shaped conductor, and the fourth loop-shaped conductor may be formed in a plurality of base material layers and may be connected in parallel. According to this configuration, direct current resistance (DCR) is small, and a resistive loss is significantly reduced or prevented.

A plurality of sets of the first loop-shaped conductors and the second loop-shaped conductors may be stacked. According to this configuration, the inductance values of the first coil element and the second coil element is set with a higher degree of freedom.

The impedance transformation circuit preferably includes a feeder port connected to a first end of the first coil element, an antenna port connected to a second end of the first coil element and a first end of the second coil element, and a ground port connected to a second end of the second coil element.

According to the above configuration, the impedance matching becomes easy to attain in a case where an antenna element having impedance lower than the impedance of the feeder circuit is used. In addition, since an equivalent negative inductance is generated in series with the antenna port, this negative inductance component cancels out an inductance component that the antenna element itself has and the inductance component of the antenna element becomes small in appearance. That is, since an effective inductive reactance component of the antenna element becomes small, the impedance matching becomes easy to attain over a broad band.

A wireless communication apparatus according to another preferred embodiment of the present invention includes a wireless communication circuit, wherein the impedance transformation circuit according to any one of the various preferred embodiments of the present invention described above is provided in the wireless communication circuit.

According to various preferred embodiments of the present invention, the first coil element has a larger self-inductance than the second coil element. In addition, although the first coil element and the second coil element preferably have the same or substantially the same shape, the first coil element and the second coil element have different inductance values. Further, the loop-shaped conductor of the first coil element and the loop-shaped conductor of the second coil element are in proximity to each other in the stacking direction and are coupled by mutual induction, and therefore, a sufficient coupling coefficient is obtained between the first coil element and the second coil element. Therefore, even though the coils are small, a predetermined (large) coupling coefficient obtained, and an impedance transformation circuit having a predetermined impedance transformation ratio is obtained.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 11 is a figure illustrating, on a Smith chart, the impedance of the impedance transformation circuit 25.

FIGS. 12A, 12B, and 12C are circuit diagrams and figures illustrating frequency characteristics of an antenna device including an impedance transformation circuit according to a preferred embodiment of the present invention and a comparative example thereof.

DETAILED DESCRIPTION OF THE PREFERRED EMBODIMENTS

First Preferred Embodiment

Figure 1A:
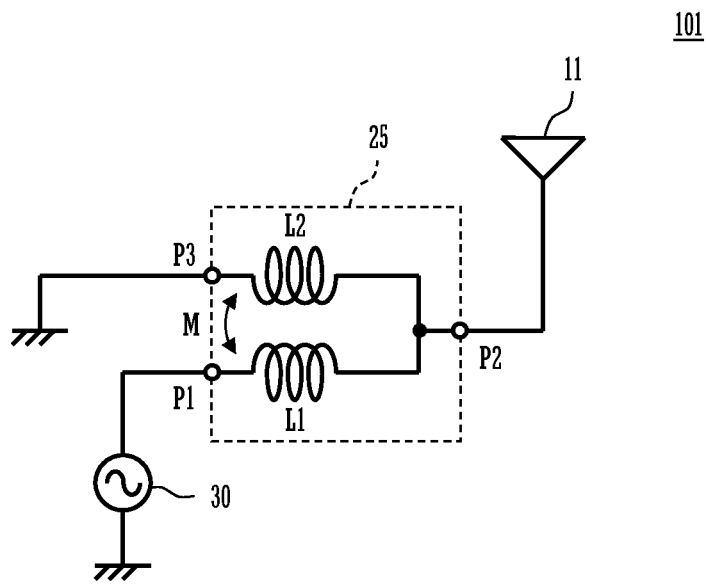
FIG. 1A is a circuit diagram of an antenna device 101 including an impedance transformation circuit 25 according to a first preferred embodiment of the present invention.
Figure 1B:
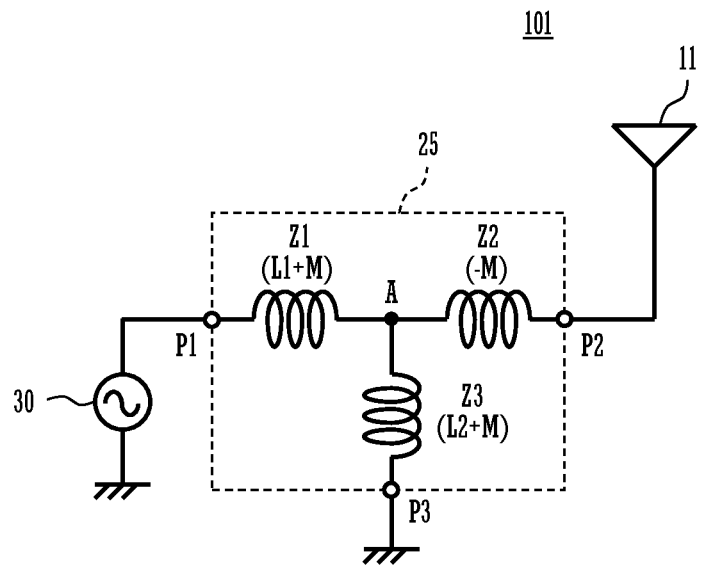
FIG. 1B is an equivalent circuit diagram thereof.

FIG. 1A is a circuit diagram of an antenna device 101 preferably including an impedance transformation circuit 25 according to a first preferred embodiment of the present invention, and FIG. 1B is an equivalent circuit diagram thereof. For example, in a case of a penta-band supported cellular phone terminal, the cellular phone terminal supports five bands GSM850/900/1800/1900, and UMTS band 1 (GSM is a registered trademark).

As illustrated in FIG. 1A, the antenna device 101 includes an antenna element 11 and the impedance transformation circuit 25 connected to the antenna element 11. In the Low Band, the antenna element 11 resonates in a fundamental wave mode, and in the High Band, the antenna element 11 resonates in a higher harmonic wave mode. The impedance transformation circuit 25 is connected to a feeder terminal of the antenna element 11. In the impedance transformation circuit 25, a primary coil L1 is inserted between the antenna element 11 and a feeder circuit 30. The feeder circuit 30 is a feeder circuit configured to feed a radio frequency signal into the antenna element 11, and generates and processes the radio frequency signal but may also include a circuit which multiplies and demultiplies radio frequency signals.

The impedance transformation circuit 25 includes the primary coil L1 ("first coil element" according to a preferred embodiment of the present invention) connected to the feeder circuit 30 and a secondary coil L2 ("second coil element" according to a preferred embodiment of the present invention) coupled to the primary coil L1. More specifically, a first end of the primary coil L1 is connected to the feeder circuit 30, and a second end thereof is connected to the antenna element 11. A first end of the secondary coil L2 is connected to the antenna element 11, and a second end thereof is connected to the ground.

This impedance transformation circuit 25 includes a transformer-type circuit in which the primary coil L1 and the secondary coil L2 are tightly coupled via a mutual inductance M. As illustrated in FIG. 1B, this transformer-type circuit can be equivalently converted into a T-type circuit including three inductance elements Z1, Z2, Z3. That is, this T-type circuit includes a first port P1 connected to the feeder circuit 30, a second port P2 connected to the antenna element 11, a third port P3 connected to the ground, the inductance element Z1 connected between the first port P1 and a branch point A, the inductance element Z2 connected between the second port P2 and the branch point A, and the third inductance element Z3 connected between the third port P3 and the branch point A.

An inductance of the primary coil L1 as illustrated in FIG. 1A is represented by L1, an inductance of the secondary coil L2 is represented by L2, and the mutual inductance is represented by M. In this case, an inductance of the inductance element Z1 in FIG. 1B is L1+M, an inductance of the inductance element Z2 is −M, and an inductance of the third inductance element Z3 is L2+M.

In the T-type circuit as illustrated in FIG. 1B, a portion (Z1 and Z3) included between the port P1 connected to the feeder circuit 30 and the port P3 connected to the ground is a portion that contributes to the impedance transformation based on a transformer ratio. That is, an impedance transformation ratio of the impedance transformation circuit 25 is (L1+L2+2M):L2.

Figure 2A:
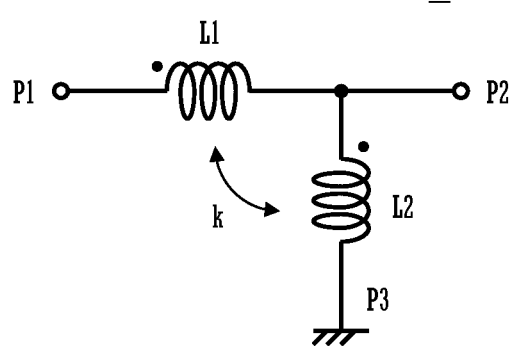
FIG. 2A is a circuit diagram of the impedance transformation circuit 25.
Figure 2B:
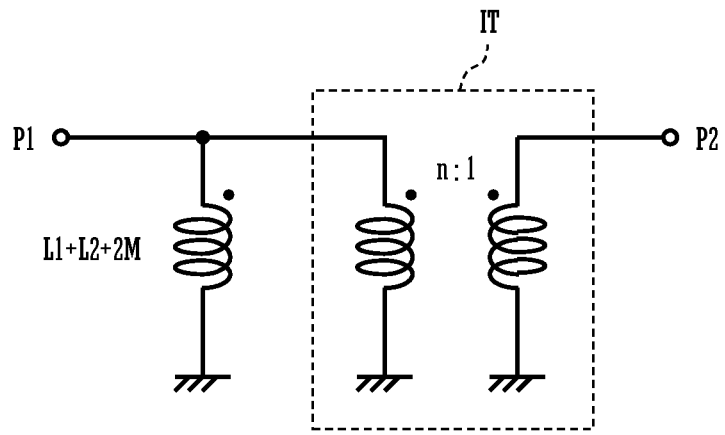
FIG. 2B is an equivalent circuit diagram thereof.

FIG. 2A is a circuit diagram of the impedance transformation circuit 25, and FIG. 2B is an equivalent circuit diagram thereof. Here, in order to simplify the description, a coupling coefficient k between the primary coil L1 and the secondary coil L2 included in the impedance transformation circuit 25 is considered to be one. In this case, the impedance transformation circuit 25 is regarded as a circuit that includes a shunt-connected inductor having an inductance (L1+L2+2M) and an ideal transformer IT. Here, M=k·√(L1−L2), and the inductor having the inductance (L1+L2+2M) is an inductor connected between the port P1 and the ground as illustrated in FIG. 2B, and the ideal transformer IT is an impedance transformation circuit having a turns ratio n:1 between the primary coil L1 and the secondary coil L2.

Figure 3A:
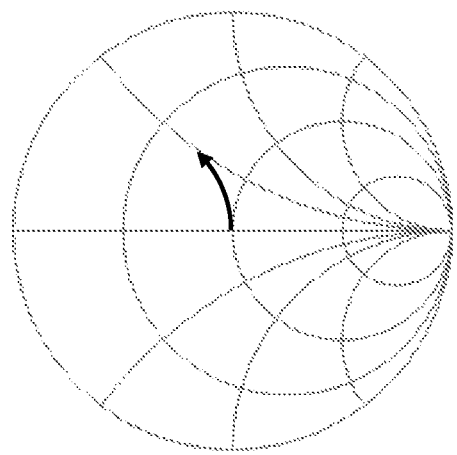
FIG. 3A is a figure illustrating, on a Smith chart, movement of the impedance with an inductor having shunt connection as illustrated in FIG. 2B.
Figure 3B:
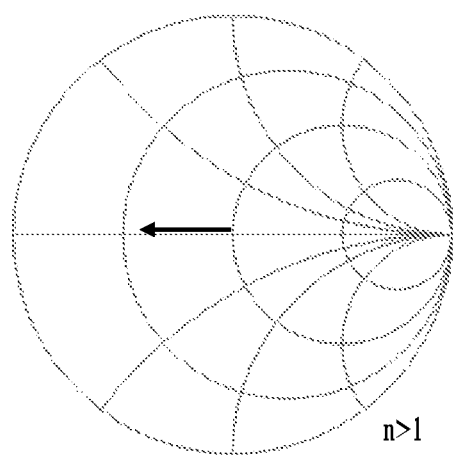
FIG. 3B is a figure illustrating, on a Smith chart, movement of the impedance with an ideal transformer IT as illustrated in FIG. 2B.

FIG. 3A is a figure illustrating, on a Smith chart, movement of the impedance with the inductor having shunt connection as illustrated in FIG. 2B, and FIG. 3B is a figure illustrating, on a Smith chart, movement of the impedance with the ideal transformer IT as illustrated in FIG. 2B. When the inductance of the inductor having the shunt connection is sufficiently large, the impedance transformation circuit 25 as illustrated in FIGS. 1A and 1B does not have frequency dependency. That is, the impedance transformation ratio is constant without depending on the frequency. When the inductance of the inductor having the shunt connection is a somewhat small value, the impedance is inductive as illustrated in FIG. 3A and shifts to a lower impedance side, and therefore, a difference occurs in the impedance between the Low Band and the High Band.

Figure 4:
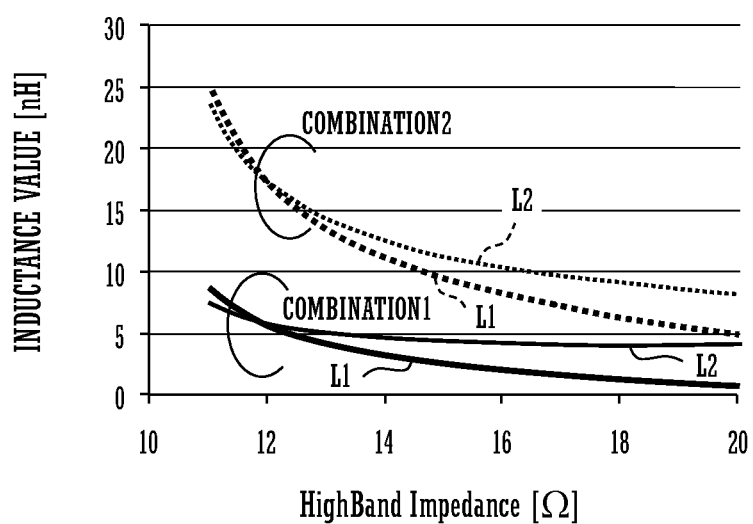
FIG. 4 illustrates an example of impedance in the High Band with respect to inductances of a primary coil and a secondary coil in a case where the impedance in the Low Band is about 10Ω, for example.

In this manner, when the number of turns of each of the primary coil L1 and the secondary coil L2 is small and the inductance is small, the impedance transformation circuit 25 has frequency dependency. Therefore, when the coupling coefficient between the primary coil and the secondary coil, the impedance of the antenna in the Low Band, and the impedance of the antenna in the High Band are defined, there are two combinations of the inductances of the primary coil and the secondary coil in order to achieve the above definition. FIG. 4 illustrates an example of impedance in the High Band with respect to the inductances of the primary coil and the secondary coil in a case where the impedance in the Low Band is about 10Ω, for example. Here, the inductance of the primary coil is represented by L1, and the inductance of the secondary coil is represented by L2. Specifically, a circuit simulator is used to perform calculation by allocating the values of L1 and L2 in details, and L1 and L2 that attain necessary impedance are plotted. In addition, the coupling coefficient is set to be k=0.5.

In FIG. 4, a "combination 2" which is a combination having large inductances has large inductance values, and a resistance component included therein is also large, and therefore, a loss is large. Therefore, from the perspective of the loss, a "combination 1" which is a combination having small inductance values is preferably used.

Figure 5:
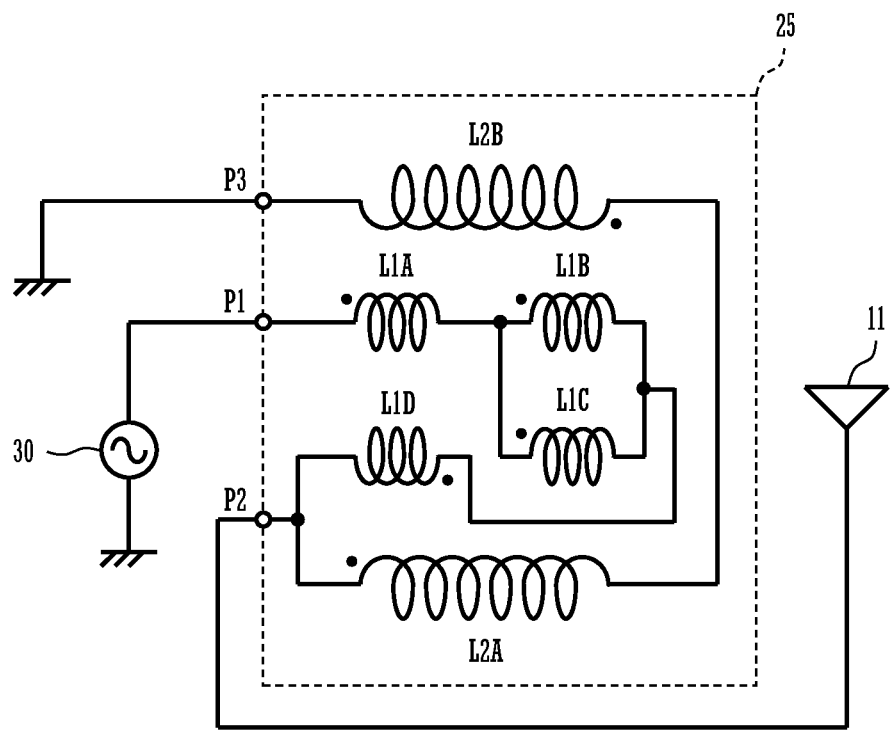
FIG. 5 is a circuit diagram of the impedance transformation circuit 25 according to the first preferred embodiment of the present invention shown in view of an arrangement relationship of the primary coil and the secondary coil.
Figure 6:
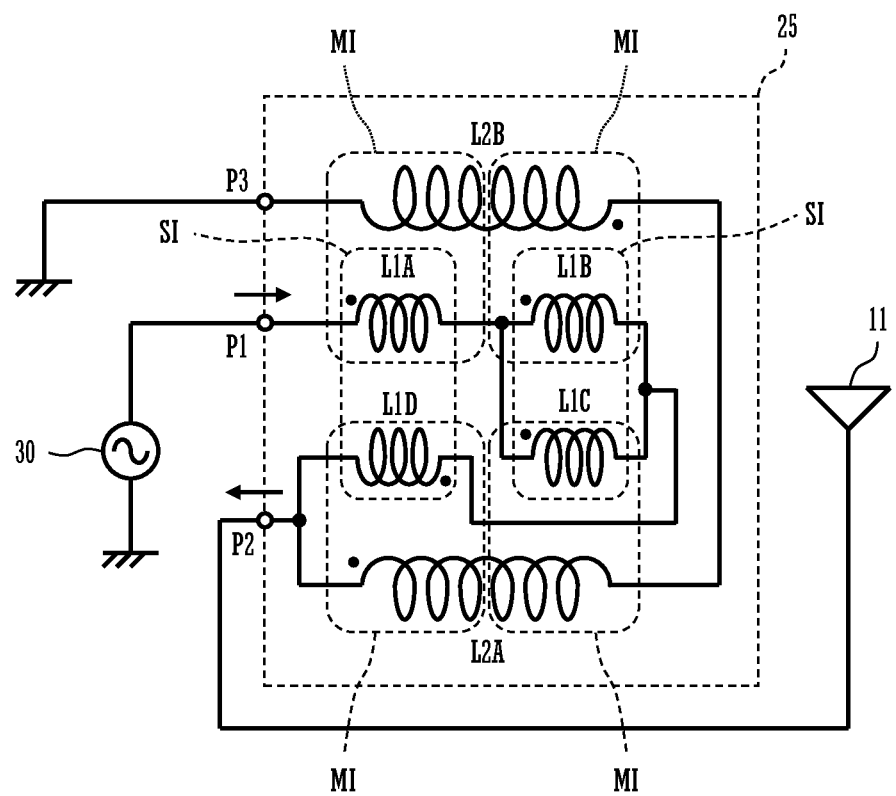
FIG. 6 is a figure illustrating coupling between the coils in the impedance transformation circuit 25.
Figure 7:
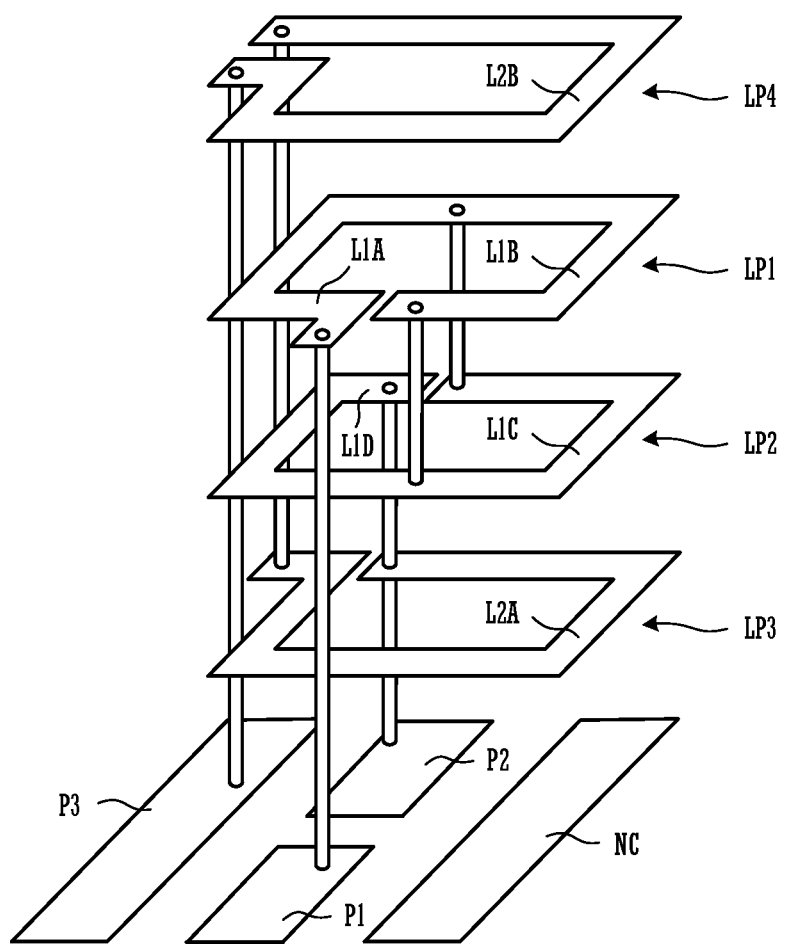
FIG. 7 is a perspective view of various kinds of conductive patterns in the impedance transformation circuit 25.

The impedance transformation circuit 25 is preferably formed by disposing a conductive pattern in a stacked element that is preferably formed by stacking a plurality of dielectric base material layers. That is, the impedance transformation circuit 25 preferably has a stacked body structure formed by stacking a dielectric base material layer and a conductive pattern. FIG. 5 is a circuit diagram of the impedance transformation circuit 25 according to the first preferred embodiment shown in view of an arrangement relationship of the primary coil and the secondary coil in the stacked element. FIG. 6 is a figure illustrating coupling between the coils. FIG. 7 is a perspective view of various kinds of conductive patterns in the impedance transformation circuit 25. The dielectric base material layers in which these conductive patterns are formed are omitted and are not drawn therein.

It is to be noted that the base material layer may not only be a dielectric but may also be a magnetic body. The coupling between the primary coil and the secondary coil can be made large by using the magnetic body (a still larger coupling coefficient is obtained). In addition, both of a magnetic body layer and a dielectric layer may be used.

As shown in FIG. 7, a first loop-shaped conductor LP1 with conductive patterns L1A, L1B, a second loop-shaped conductor LP2 with conductive patterns L1C, L1D, a third loop-shaped conductor LP3 with a conductive pattern L2A, and a fourth loop-shaped conductor LP4 with a conductive pattern L2B are respectively provided. The conductive patterns in the layers are interlayer-connected by via conductors.

Terminals corresponding to the first port (feeder port) P1, the second port (antenna port) P2, and the third port (ground port) P3, and a terminal for other implementation (vacant terminal NC) are provided on a lower surface of the base material layer serving as the lowermost layer. These terminals are provided on the lower surface of the base material layer defining and serving as the lowermost layer.

The first coil element (L1 as illustrated in FIG. 1A) includes the first loop-shaped conductor LP1 and the second loop-shaped conductor LP2. The second coil element (L2 as illustrated in FIG. 1A) includes the third loop-shaped conductor LP3 and the fourth loop-shaped conductor LP4.

The first loop-shaped conductor LP1 and the second loop-shaped conductor LP2 are sandwiched in a stacking direction between the third loop-shaped conductor LP3 and the fourth loop-shaped conductor LP4.

The conductive pattern L1B which is a portion of the first loop-shaped conductor LP1 and the conductive pattern L1C which is a portion of the second loop-shaped conductor LP2 are connected in parallel. Then, each of the conductive pattern L1A which is a remaining portion of the first loop-shaped conductor LP1 and the conductive pattern L1D which is a remaining portion of the second loop-shaped conductor LP2 is connected in series with the parallel circuit.

The third loop-shaped conductor LP3 with the conductive pattern L2A and the fourth loop-shaped conductor LP4 with the conductive pattern L2B are connected in series.

As illustrated in FIG. 6, a large inductance value of the primary coil is obtained by strong magnetic field coupling (self-inductance SI) between the conductive patterns L1A and L1D and strong magnetic field coupling (self-inductance SI) between the conductive patterns L1B and L1C. Therefore, the inductance per coil length is large, and the Q value of the primary coil is improved, so that the loss is reduced.

In addition, the coupling coefficient between the primary coil (first coil element L1) and the secondary coil (second coil element L2) is increased by magnetic field coupling (mutual induction MI) between the conductive patterns L1A, L1B and the conductive pattern L2B and magnetic field coupling (mutual induction MI) between the conductive patterns L1C, L1D and the conductive pattern L2A.

Figure 8:
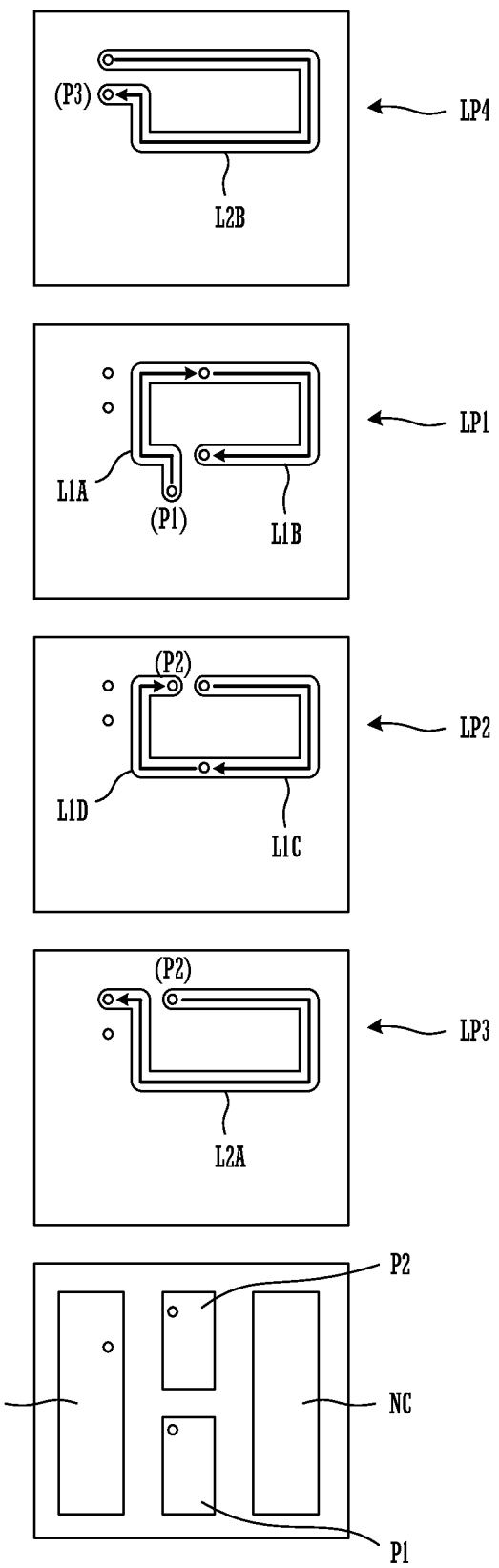
FIG. 8 is a figure illustrating a conductive pattern and an electric current path provided in each base material layer in the impedance transformation circuit 25.

FIG. 8 is a figure illustrating a conductive pattern and an electric current path formed in each base material layer in the impedance transformation circuit 25. In FIG. 8, electric current flows in the first loop-shaped conductor LP1 and the second loop-shaped conductor LP2 through the following path: the first port P1, to the conductive pattern L1A, to the conductive pattern (L1B+L1C), to the conductive pattern L1D, and to the second port P2. In addition, electric current flows in the third loop-shaped conductor LP3 and the fourth loop-shaped conductor LP4 through the following path: the second port P2, to the conductive pattern L2A, to the conductive pattern L2B, and to the third port P3. That is, the primary coil includes a parallel portion having the conductive patterns L1B, L1C and a series portion having the conductive patterns L1A, L1D. In addition, the secondary coil includes a series portion having the conductive patterns L2A, L2B.

Figure 9:
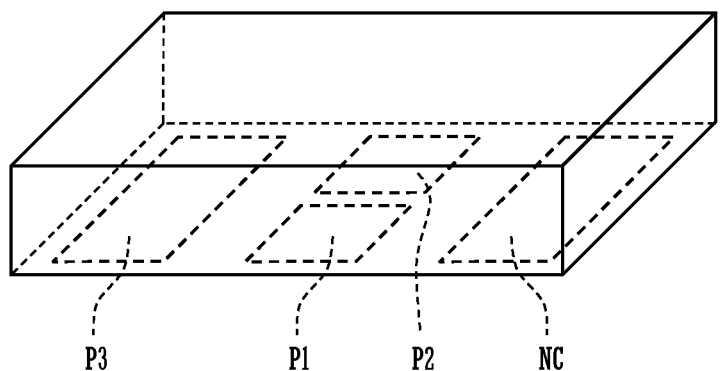
FIG. 9 is a perspective view of the impedance transformation circuit 25.
Figure 10:
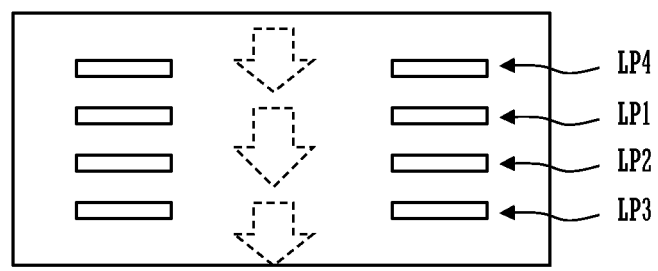
FIG. 10 is a front side longitudinal cross sectional view of the impedance transformation circuit 25 and a figure illustrating how the magnetic flux passes.

FIG. 9 is a perspective view of a stacked body included in the impedance transformation circuit 25. FIG. 10 is a front side longitudinal cross sectional view illustrating how the magnetic flux thereof passes. Electric current flows through the loop-shaped conductors LP1, LP2, LP3, LP4, and thus the magnetic flux passes in the same direction through each of the loop-shaped conductors LP1, LP2, LP3, LP4. That is, the loop-shaped conductors LP1, LP2, LP3, LP4 are wound and connected in a direction to strengthen the magnetic flux of each other.

FIG. 11 is a figure illustrating, on a Smith chart, the impedance of the impedance transformation circuit 25. In this example, the inductance of the primary coil L1 preferably is set to about 3.4 nH, the inductance of the secondary coil preferably is set to about 4.6 nH, and the coupling coefficient preferably is set to about 0.5. Here, marks m1, m2 are impedance from the viewpoint of the second port (antenna-side port) P2, and marks m3, m4 are impedance from the viewpoint of the first port (feeder-side port) P1. In addition, the marks m1, m3 are impedance at about 884 MHz (Low Band), and the marks m2, m4 are impedance at about 1.94 GHz (High Band), for example. The impedance indicated by the mark m1 in the Low Band from the viewpoint of the second port (antenna-side port) P2 is about 13Ω, and the impedance indicated by the mark m2 in the High Band from the viewpoint of the second port (antenna-side port) P2 is about 18Ω, for example.

As described above, this matches the antenna having about 13Ω in the Low Band and about 18Ω in the High Band, for example.

FIGS. 12A, 12B, and 12C are figures illustrating circuit diagrams and figures illustrating frequency characteristics of an antenna device including an impedance transformation circuit according to a preferred embodiment of the present invention and a comparative example thereof. FIG. 12A is a figure illustrating a circuit diagram of an antenna element alone and frequency characteristics thereof. FIG. 12B is a circuit diagram of an antenna device including an impedance matching inductor and frequency characteristics thereof. Any one of FIG. 12A and FIG. 12B is a comparative example. FIG. 12C is a circuit diagram of an antenna device including an impedance transformation circuit according to a preferred embodiment of the present invention and frequency characteristics thereof.

FIGS. 12A, 12B, and 12C illustrate reflection losses S55, S33, S11, and insertion losses S65, S43, S21 in the Low Band.

As shown in FIG. 12A and FIG. 12B, when a predetermined inductor L is connected in parallel with the feeder circuit 30 in order to attain impedance matching, a reflection loss becomes small at a predetermined frequency because of resonance but the resonance frequency becomes lower than a resonance frequency with the antenna element alone because of the disposition of the inductor L. A frequency indicated by a mark m5 illustrated in FIG. 12A is about 967 MHz, and a frequency indicated by a mark m3 illustrated in FIG. 12B is about 888 MHz, for example. For this reason, it is necessary to design both of the design of the antenna element 11 and the impedance matching circuit at the same time. In contrast, as illustrated in FIG. 12C, according to the impedance transformation circuit of a preferred embodiment of the present invention, a negative inductance (−M) is connected in series with a feeder point of the antenna element 11, and therefore, the impedance matching is attained while the resonance frequency does not significantly decrease. A frequency indicated by a mark m1 illustrated in FIG. 12C is about 926 MHz.

Second Preferred Embodiment

Figure 13:
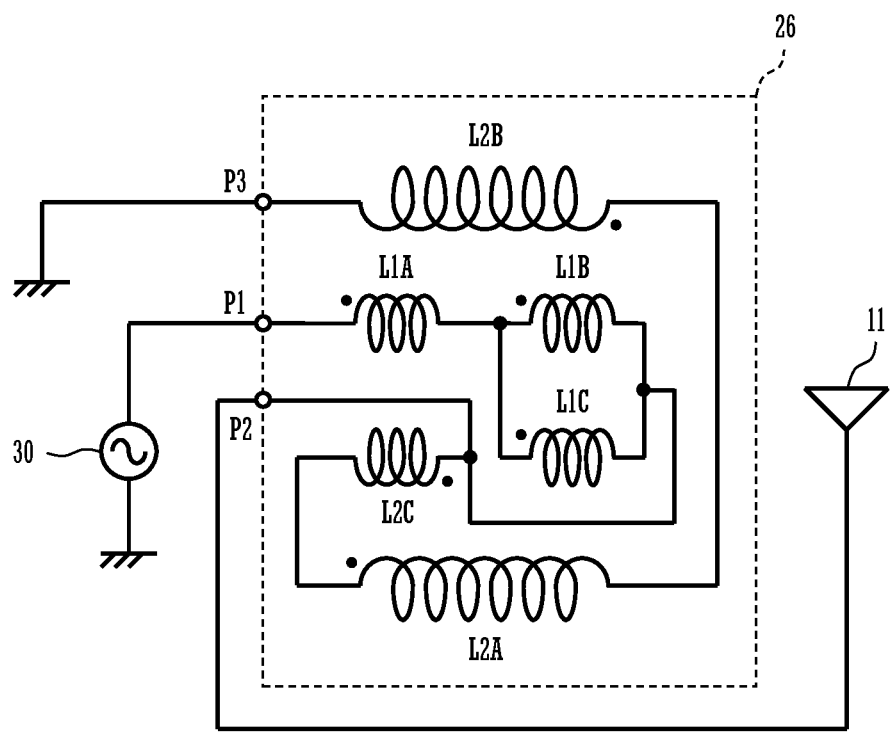
FIG. 13 is a circuit diagram of an impedance transformation circuit 26 according to a second preferred embodiment of the present invention shown in view of an arrangement relationship between a primary coil and a secondary coil.
Figure 14:
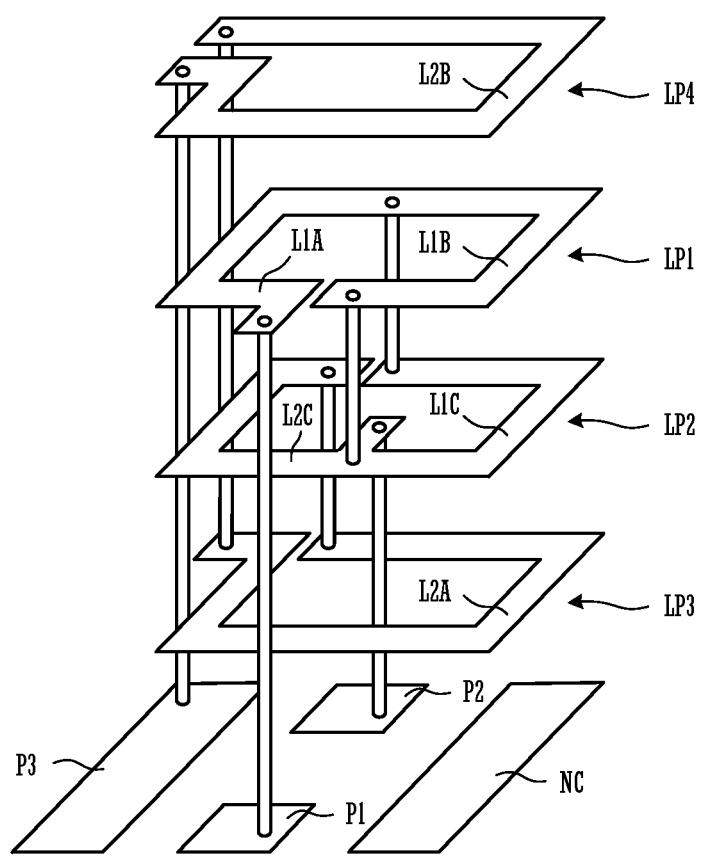
FIG. 14 is a perspective view of various kinds of conductive patterns in the impedance transformation circuit 26.

FIG. 13 is a circuit diagram of an impedance transformation circuit 26 according to a second preferred embodiment of the present invention shown in view of an arrangement relationship between a primary coil and a secondary coil. Like the impedance transformation circuit 25 according to the first preferred embodiment of the present invention, the impedance transformation circuit 26 according to this preferred embodiment preferably includes a stacked body structure in which a dielectric base material layer and a conductive pattern are stacked. The same applies to each of preferred embodiments described after this preferred embodiment. FIG. 14 is a perspective view of various kinds of conductive patterns in the impedance transformation circuit 26. However, the dielectric base material layers on which these conductive patterns are provided are omitted and are not drawn therein.

As shown in FIG. 14, a first loop-shaped conductor LP1 with conductive patterns L1A, L1B, a second loop-shaped conductor LP2 with conductive patterns L2C, L1C, a third loop-shaped conductor LP3 with a conductive pattern L2A, and a fourth loop-shaped conductor LP4 with a conductive pattern L2B are respectively provided. The conductive patterns in the layers are interlayer-connected by via conductors.

Unlike the first preferred embodiment illustrated in FIG. 5 and FIG. 7, the conductive pattern L2C connected in series with the third loop-shaped conductor LP3 (conductive pattern L2A) is provided in the second loop-shaped conductor LP2.

According to this configuration, the number of turns and the inductance of the secondary coil is increased, and the setting range of impedance transformation ratios is expanded.

It is to be noted that, likewise, a conductive pattern connected in series with one of the third loop-shaped conductor LP3 (conductive pattern L2A) and the fourth loop-shaped conductor LP4 (conductive pattern L2B) may be provided in the first loop-shaped conductor LP1. In addition, a conductive pattern connected in series with the fourth loop-shaped conductor LP4 (conductive pattern L2B) may be provided in the second loop-shaped conductor LP2.

Third Preferred Embodiment

Figure 15:
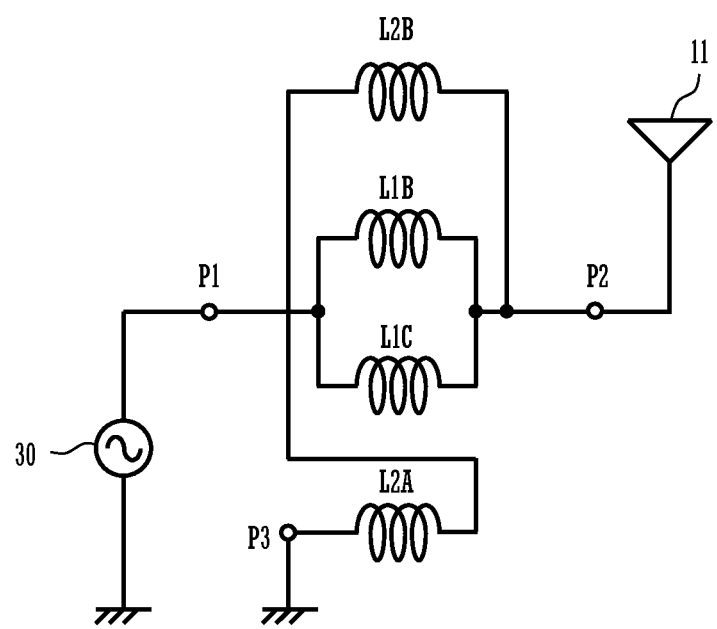
FIG. 15 is a circuit diagram of an impedance transformation circuit 27A according to a third preferred embodiment of the present invention.
Figure 16:
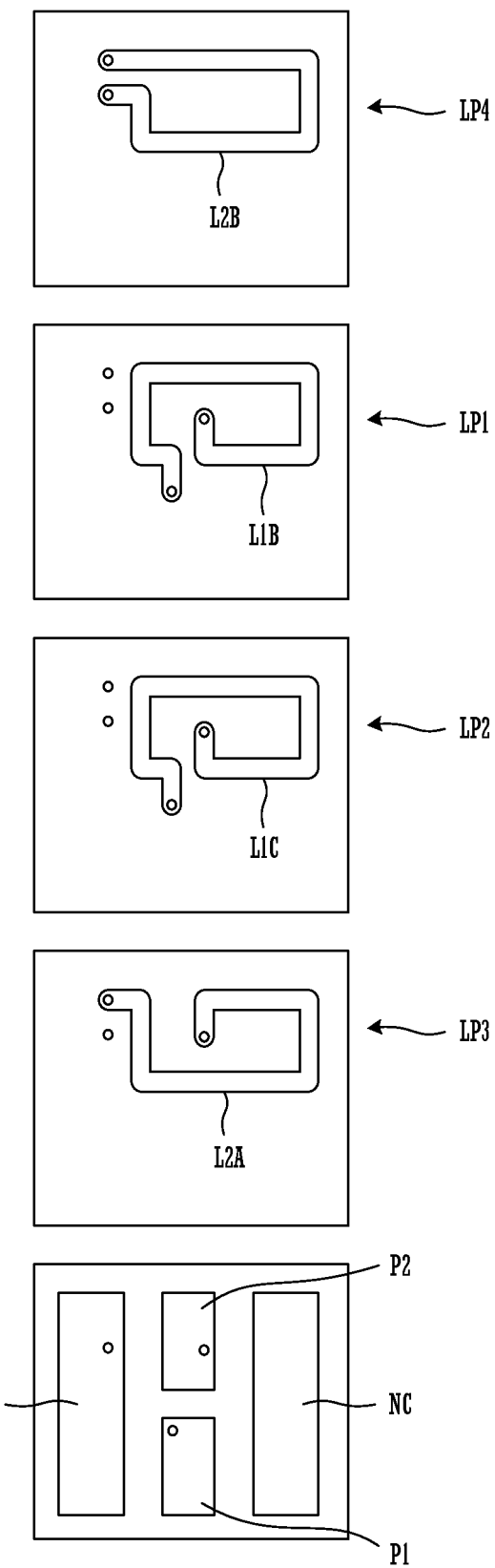
FIG. 16 is a figure illustrating a conductive pattern provided in each base material layer of the impedance transformation circuit 27A according to the third preferred embodiment of the present invention.

FIG. 15 is a circuit diagram of an impedance transformation circuit 27A according to a third preferred embodiment of the present invention. FIG. 16 is a figure illustrating a conductive pattern provided in each base material layer of the impedance transformation circuit 27A according to the third preferred embodiment. It is to be noted that the basic configuration is the same as that of the impedance transformation circuit 25 according to the first preferred embodiment, and therefore, the description thereof is omitted here. In this example, a primary coil includes conductive patterns L1B, L1C, and a secondary coil includes conductive patterns L2A, L2B. The conductive pattern L1B, L1C included in the primary coil are adjacent to each other in a stacking direction, and are connected in parallel. The conductive patterns L2A, L2B included in the secondary coil are arranged so as to sandwich the conductive patterns L1B, L1C in the stacking direction, and are connected in series.

Like this preferred embodiment, all of a first loop-shaped conductor LP1 and a second loop-shaped conductor LP2 may be connected in parallel.

Fourth Preferred Embodiment

Figure 17:
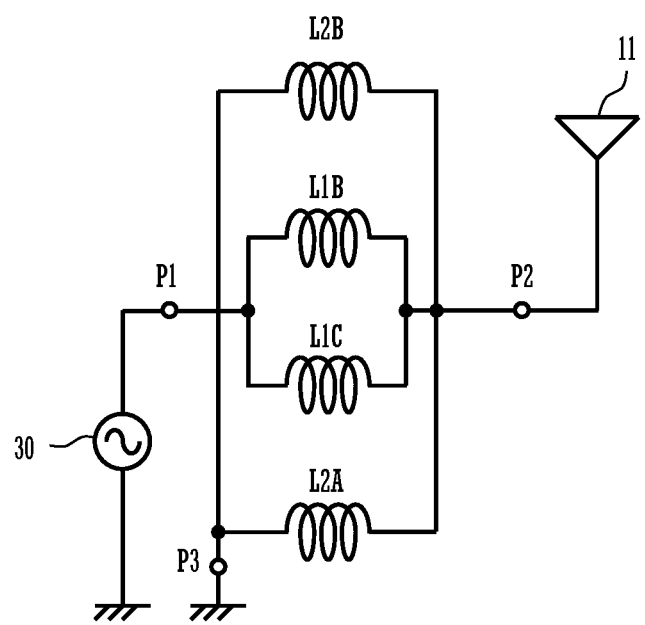
FIG. 17 is a circuit diagram of an impedance transformation circuit 27B according to a fourth preferred embodiment of the present invention.

FIG. 17 is a circuit diagram of an impedance transformation circuit 27B according to a fourth preferred embodiment of the present invention. It is to be noted that the basic configuration is the same as that of the impedance transformation circuit 25 according to the first preferred embodiment, and therefore, the description thereof is omitted here. In this example, a primary coil includes conductive patterns L1B, L1C, and a secondary coil includes conductive patterns L2A, L2B. The conductive pattern L1B, L1C included in the primary coil are adjacent to each other in a stacking direction, and are connected in parallel. The conductive patterns L2A, L2B included in the secondary coil are arranged so as to sandwich the conductive patterns L1A, L1B in the stacking direction, and are connected in parallel.

Like this preferred embodiment, all of the secondary coil may be connected in parallel.

As described in the above several preferred embodiments of the present invention, each of the primary coil and the secondary coil may be configured either in series connection or in parallel connection. In a case where a single coil includes two inductors, when the inductance of the one inductor is represented by Lu, the inductance of the coil becomes Lu×2 in series connection and the inductance of the coil becomes Lu/2 in parallel connection. Then, when the coil is arranged in an inner side layer, the self-inductance improves and the inductance increases, as compared with a case where the coil is arranged in an outer side layer.

Therefore, it is only necessary to determine a connection configuration of the primary coil and the secondary coil and an arrangement relationship of the inner side and the outer side in accordance with a coupling coefficient k of the primary coil and the secondary coil and the values of the inductance of the primary coil and the inductance of the secondary coil.

It is to be noted that, the above examples are preferably configured such that the first radio frequency circuit is the feeder circuit and the second radio frequency circuit is the antenna, but the present invention is not limited thereto and can be generally applied to an impedance transformation circuit connected between a first radio frequency circuit and a second radio frequency circuit.

Here, a relationship between the connection configuration of the primary coil and the secondary coil and an impedance transformation ratio will be described as an example.

| Primary coil L1 | Secondary coil L2 | Transformation ratio |
|---|---|---|
| Series | Series | 4:2 |
| (Series + parallel) | Series | (4 to 1):2 |
| Parallel | Series | 1:2 |
| Series | Parallel | 4:0.5 |
| (Series + parallel) | Parallel | (4 to 1):0.5 |
| Parallel | Parallel | 1:0.5 |

It is to be noted that two layers of loop-shaped conductors LP1, LP2 included in the primary coil and two layers of loop-shaped conductors LP3, LP4 included in the secondary coil have the same number of turns and have the same loop size, but the loop-shaped conductors LP1, LP2 are sandwiched by the loop-shaped conductors LP3, LP4 in a stacking direction, that is, the two layers of the loop-shaped conductors in the primary coil are adjacent to each other in the stacking direction, and therefore, the inductance of the primary coil is larger than that of the secondary coil.

As described above, the primary coil preferably includes the (series+parallel) structure, and thus the impedance transformation ratio having no separated values but extending over a wide range is realized.

Fifth Preferred Embodiment

A fifth preferred embodiment of the present invention is an example of stacking and arranging two sets of stacking structures each having the primary coil and the secondary coil in the stacked element of the impedance transformation circuit 25 as described in the first preferred embodiment. In addition, the fifth preferred embodiment is an example of disposing a series portion and a parallel portion not only in the primary coil but also in the secondary coil (including a series-parallel structure).

Figure 18:
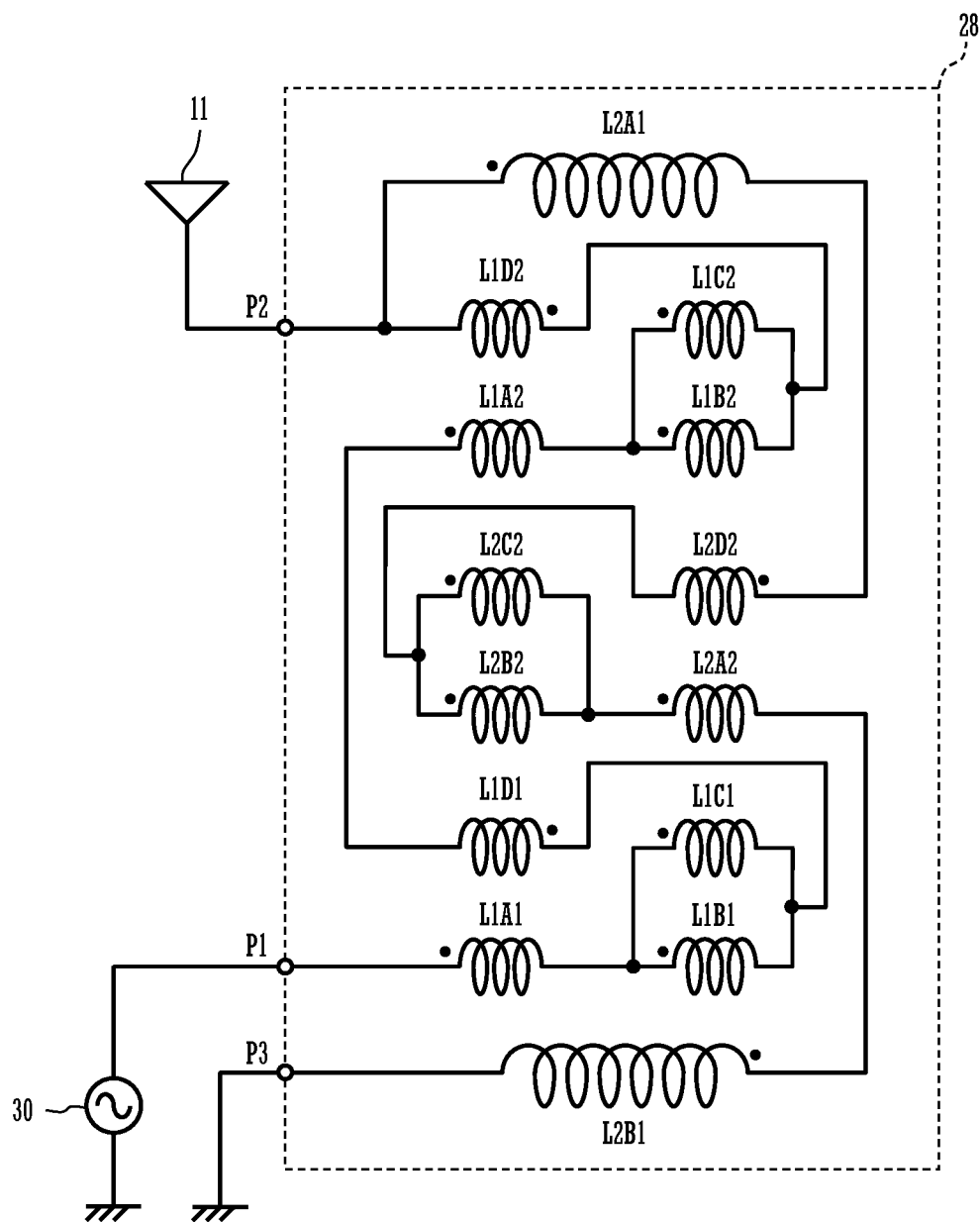
FIG. 18 is a circuit diagram of an impedance transformation circuit 28 according to a fifth preferred embodiment of the present invention shown in view of an arrangement relationship of the primary coil and the secondary coil in the stacked element.
Figure 19:
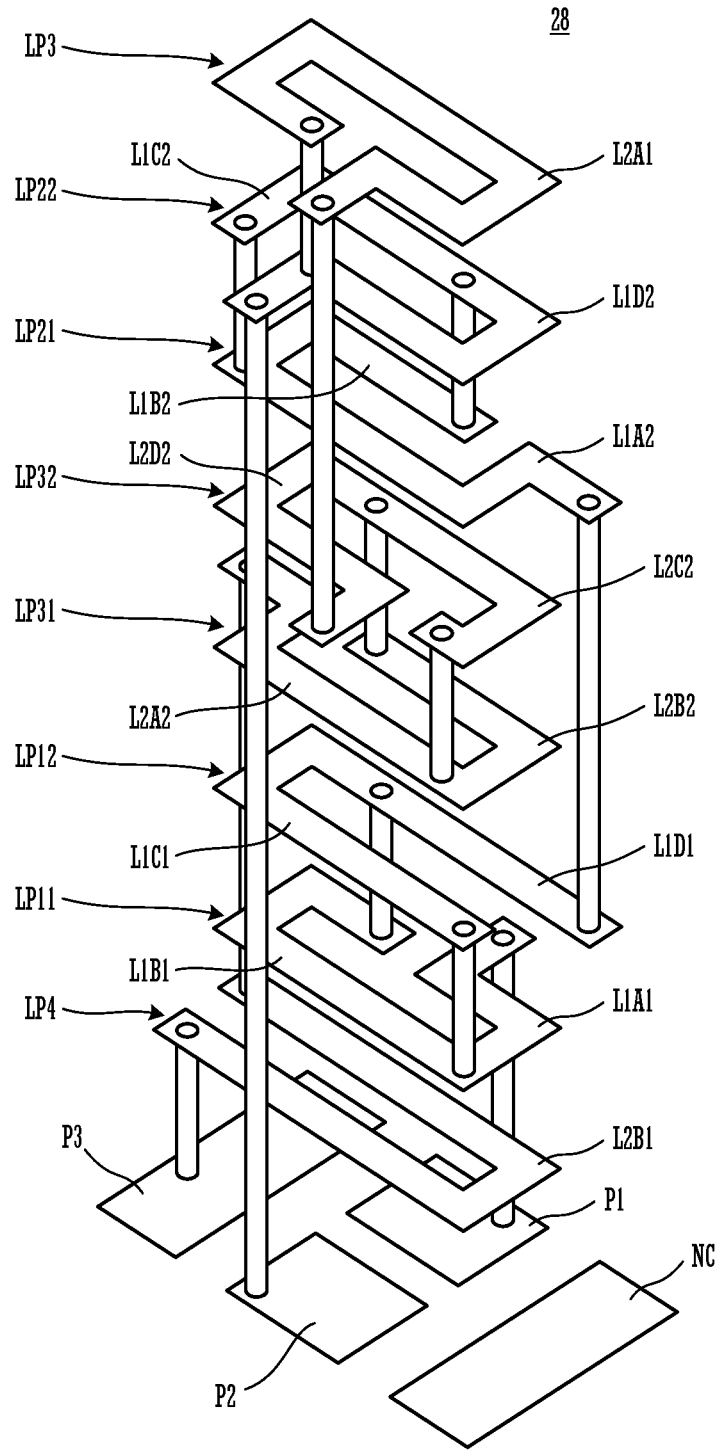
FIG. 19 is a perspective view of various kinds of conductive patterns in the impedance transformation circuit 28.
Figure 20:
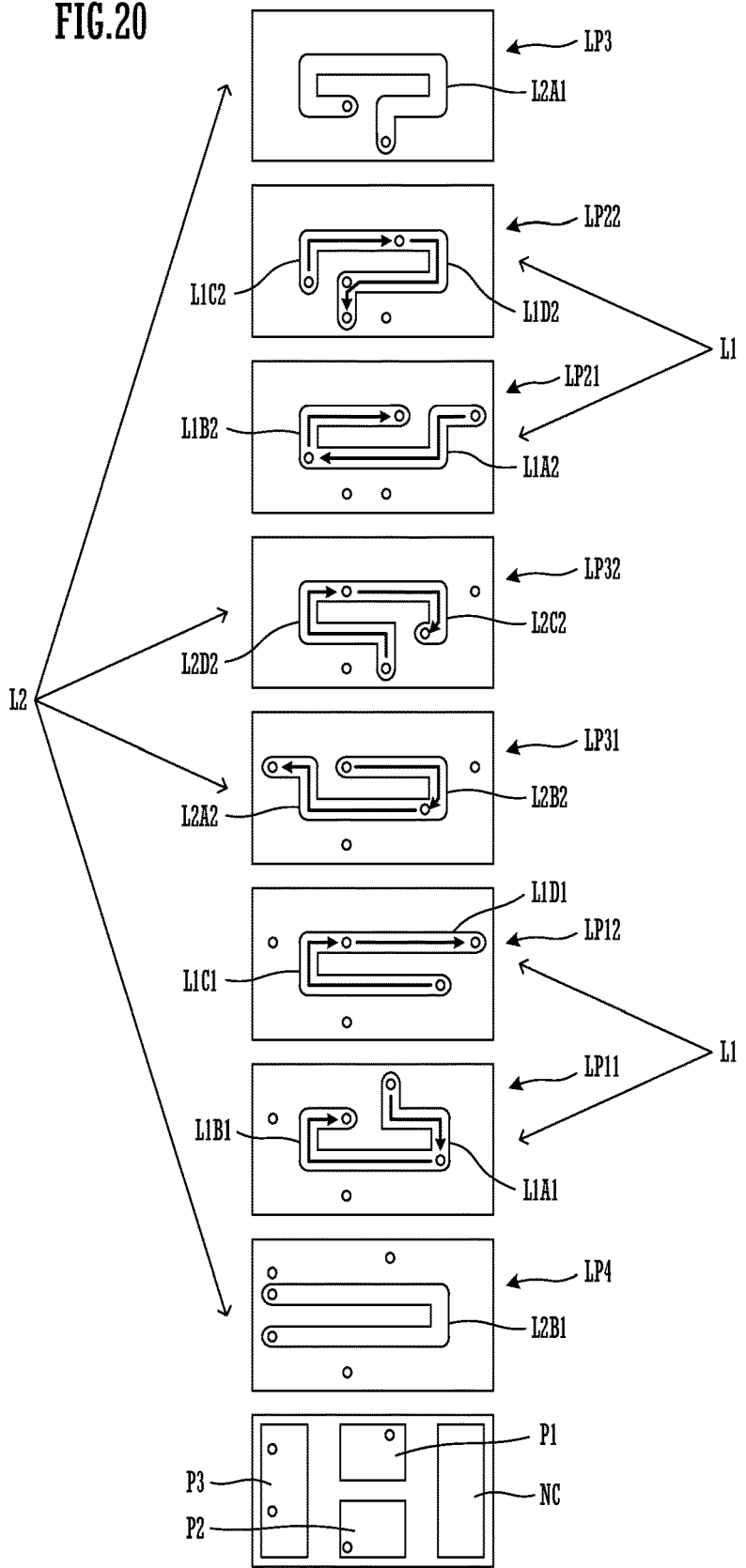
FIG. 20 is a figure illustrating a conductive pattern and an electric current path provided in each base material layer in the impedance transformation circuit 28.

FIG. 18 is a circuit diagram of an impedance transformation circuit 28 according to the fifth preferred embodiment shown in view of an arrangement relationship of the primary coil and the secondary coil in the stacked element. FIG. 19 is a perspective view of various kinds of conductive patterns in the impedance transformation circuit 28. Dielectric base material layers in which these conductive patterns are provided are omitted and are not drawn therein. FIG. 20 is a figure illustrating a conductive pattern and an electric current path provided in each base material layer in the impedance transformation circuit 28.

As shown in FIG. 19, a first loop-shaped conductor LP11 with conductive patterns L1A1, L1B1, a second loop-shaped conductor LP12 with conductive patterns L1C1, L1D1, a third loop-shaped conductor LP4 with a conductive pattern L2B1, and a fourth loop-shaped conductor LP31 with conductive patterns L2A2, L2B2 are respectively provided in this impedance transformation circuit 28. In addition, a first loop-shaped conductor LP21 with conductive patterns L1A2, L1B2, a second loop-shaped conductor LP22 with conductive patterns L1C2, L1D2, a third loop-shaped conductor LP3 with a conductive pattern L2A1, and a fourth loop-shaped conductor LP32 with conductive patterns L2C2, L2D2 are respectively formed. The conductive patterns in the layers are interlayer-connected by via conductors.

Terminals corresponding to a first port (feeder port) P1, a second port (antenna port) P2, and a third port (ground port) P3, and a terminal for other implementation (vacant terminal NC) are provided on a lower surface of the base material layer serving as the lowermost layer. These terminals are provided on the lower surface of the base material layer defining and serving as the lowermost layer.

As illustrated in FIG. 20, a first coil element L1 (corresponding to the primary coil L1 as illustrated in FIG. 1A) includes the first loop-shaped conductors LP11, LP12, LP21, LP22. In addition, a second coil element L2 (corresponding to the secondary coil L2 as illustrated in FIG. 1A) includes the third loop-shaped conductors LP4, LP3 and the fourth loop-shaped conductors LP31, LP32.

The first loop-shaped conductor LP11 and the second loop-shaped conductor LP12 are sandwiched in a stacking direction between the third loop-shaped conductor LP4 and the fourth loop-shaped conductor LP31. Likewise, the first loop-shaped conductor LP21 and the second loop-shaped conductor LP22 are sandwiched in the stacking direction between the third loop-shaped conductor LP3 and the fourth loop-shaped conductor LP32.

The conductive pattern L1B1 which is a portion of the first loop-shaped conductor LP11 and the conductive pattern L1C1 which is a portion of the second loop-shaped conductor LP12 are connected in parallel. Then, each of the conductive pattern L1A1 which is a remaining portion of the first loop-shaped conductor LP11 and the conductive pattern L1D1 which is a remaining portion of the second loop-shaped conductor LP12 is connected in series with the parallel circuit. Likewise, the conductive pattern L1B2 which is a portion of the first loop-shaped conductor LP21 and the conductive pattern L1C2 which is a portion of the second loop-shaped conductor LP22 are connected in parallel. Then, each of the conductive pattern L1A2 which is a remaining portion of the first loop-shaped conductor LP21 and the conductive pattern L1D2 which is a remaining portion of the second loop-shaped conductor LP22 is connected in series with the parallel circuit.

The conductive pattern L2B2 which is a portion of the fourth loop-shaped conductor LP31 and the conductive pattern L2C2 which is a portion of the fourth loop-shaped conductor LP32 are connected in parallel. Then, each of the conductive pattern L2A2 which is a remaining portion of the fourth loop-shaped conductor LP31 and the conductive pattern L2D2 which is a remaining portion of the fourth loop-shaped conductor LP32 is connected in series with the parallel circuit.

As described above, not only the primary coil L1 but also the secondary coil L2 may have the series-parallel structure. As a result, the inductance value is set with a higher degree of freedom.

It is to be noted that the present invention is not limited to a configuration in which there are two sets of primary coils L1 each having the series-parallel structure and one set of secondary coils L2 each having the series-parallel structure. For example, stacking structures including the primary coils and the secondary coils may be further stacked and arranged such that there are three sets of the primary coils L1 each including the series-parallel structure and two sets of the secondary coils L2 each including the series-parallel structure.

Sixth Preferred Embodiment

In a sixth preferred embodiment of the present invention, an example where the present invention is applied to a radio frequency power amplifier will be described. In general, the output impedance of a power amplifier is very low, and for example, in a cellular phone terminal, the output impedance of a power amplifier for GSM (registered trademark) is about 2Ω, and the output impedance of a power amplifier for CDMA is about 4Ω, for example. As described above, when the output of the power amplifier of which output impedance is very low is matched to a transmission path of about 50Ω, it is necessary to attain matching over a broad band in order to support a system requiring a broad band such as LTE (Long Term Evolution). However, in the related art, it has been necessary to configure a multi-stage low-pass filter circuit in order to support a broad band. Therefore, the transmission loss becomes large. In addition, when an inductor of a low-pass filter includes an electrode in order to suppress the transmission loss, the area necessary to accommodate the electrode becomes large, and space saving cannot be attained.

The impedance transformation circuit according to various preferred embodiments of the present invention can also be applied to a case where the output of the power amplifier of which output impedance is very low is matched to the transmission path of about 50Ω, for example.

Figure 21:
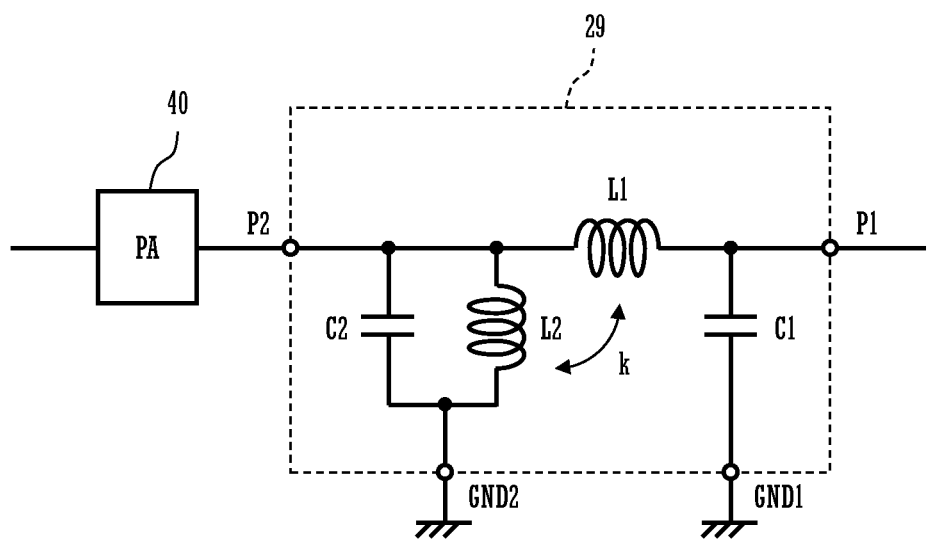
FIG. 21 is a circuit diagram of a radio frequency power amplifier including an impedance transformation circuit 29 according to a sixth preferred embodiment of the present invention.

FIG. 21 is a circuit diagram of a radio frequency power amplifier including an impedance transformation circuit 29 according to a preferred embodiment of the present invention. As illustrated in FIG. 21, the impedance transformation circuit 29 is connected to the output of a power amplifier 40. This impedance transformation circuit 29 includes a primary coil L1, a secondary coil L2, and capacitors C1, C2. A transformer with the primary coil L1 and the secondary coil L2 performs the impedance transformation. The capacitors C1, C2 are elements configured to perform fine adjustment of the impedance matching. This impedance transformation circuit 29 matches the output impedance of the power amplifier 40 to the transmission path of about 50Ω, for example.

Figure 22:
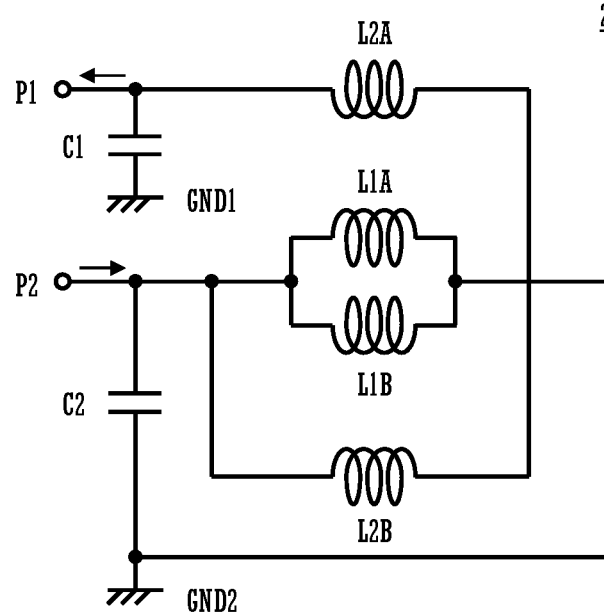
FIG. 22 is a circuit diagram of the impedance transformation circuit 29 shown in view of an arrangement relationship between a primary coil and a secondary coil in a stacked element.
Figure 23:
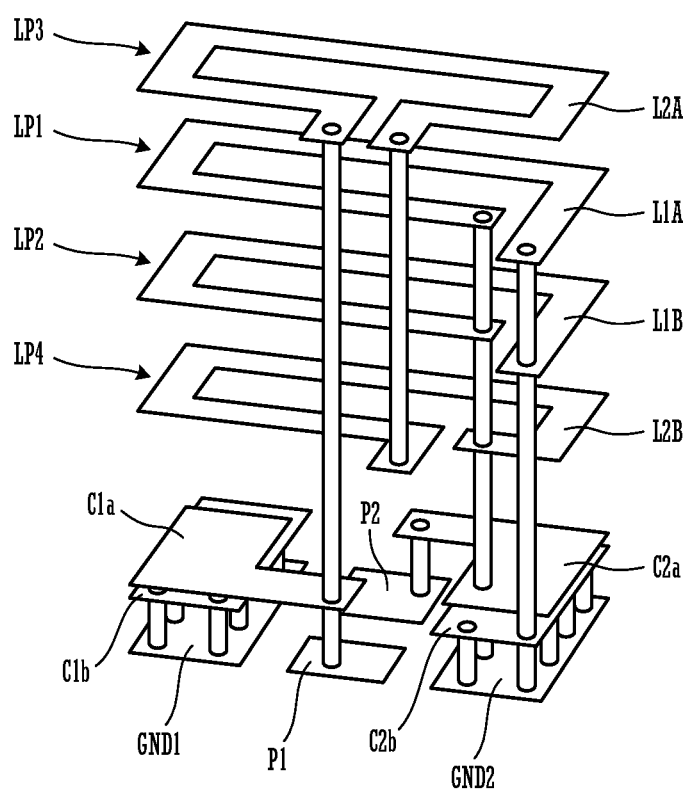
FIG. 23 is a perspective view of various kinds of conductive patterns in the impedance transformation circuit 29.

FIG. 22 is a circuit diagram of the impedance transformation circuit 29 shown in view of an arrangement relationship between a primary coil and a secondary coil in a stacked element. FIG. 23 is a perspective view of various kinds of conductive patterns in the impedance transformation circuit 29. Dielectric base material layers in which these conductive patterns are provided are omitted and are not drawn therein.

As shown in FIG. 23, a first loop-shaped conductor LP1 with a conductive pattern L1A, a second loop-shaped conductor LP2 with a conductive pattern L1B, a third loop-shaped conductor LP3 with a conductive pattern L2A, and a fourth loop-shaped conductor LP4 with a conductive pattern L2B are respectively provided. The conductive patterns in the layers are interlayer-connected by via conductors.

Terminals corresponding to a first port (output port) P1, a second port (power amplifier connection port) P2, a third port (ground port) GND1, and a fourth port (ground port) GND2 are provided on a lower surface of the base material layer defining and serving as the lowermost layer. These terminals are provided on the lower surface of the base material layer defining and serving as the lowermost layer.

The first coil element (L1 as illustrated in FIG. 21) includes the first loop-shaped conductor LP1 and the second loop-shaped conductor LP2. The second coil element (L2 as illustrated in FIG. 21) includes the third loop-shaped conductor LP3 and the fourth loop-shaped conductor LP4.

The first loop-shaped conductor LP1 and the second loop-shaped conductor LP2 are sandwiched in a stacking direction between the third loop-shaped conductor LP3 and the fourth loop-shaped conductor LP4.

The conductive pattern L1A which is the first loop-shaped conductor LP1 and the conductive pattern L1B which is the second loop-shaped conductor LP2 are connected in parallel. In addition, the third loop-shaped conductor LP3 and the fourth loop-shaped conductor LP4 are connected in series.

In addition, inside the stacked element, capacitor electrodes C1a, C1b, C2a, C2b are provided. A capacitor C1 includes the capacitor electrodes C1a, C1b, and a capacitor C2 includes the capacitor electrodes C2a, C2b.

It is to be noted that the fifth preferred embodiment has described the example where all of the first loop-shaped conductor LP1 and the second loop-shaped conductor LP2 are connected in parallel, but like the above several preferred embodiments, at least portions of the first loop-shaped conductor LP1 and the second loop-shaped conductor LP2 may be connected in parallel.

Seventh Preferred Embodiment

Figure 24:
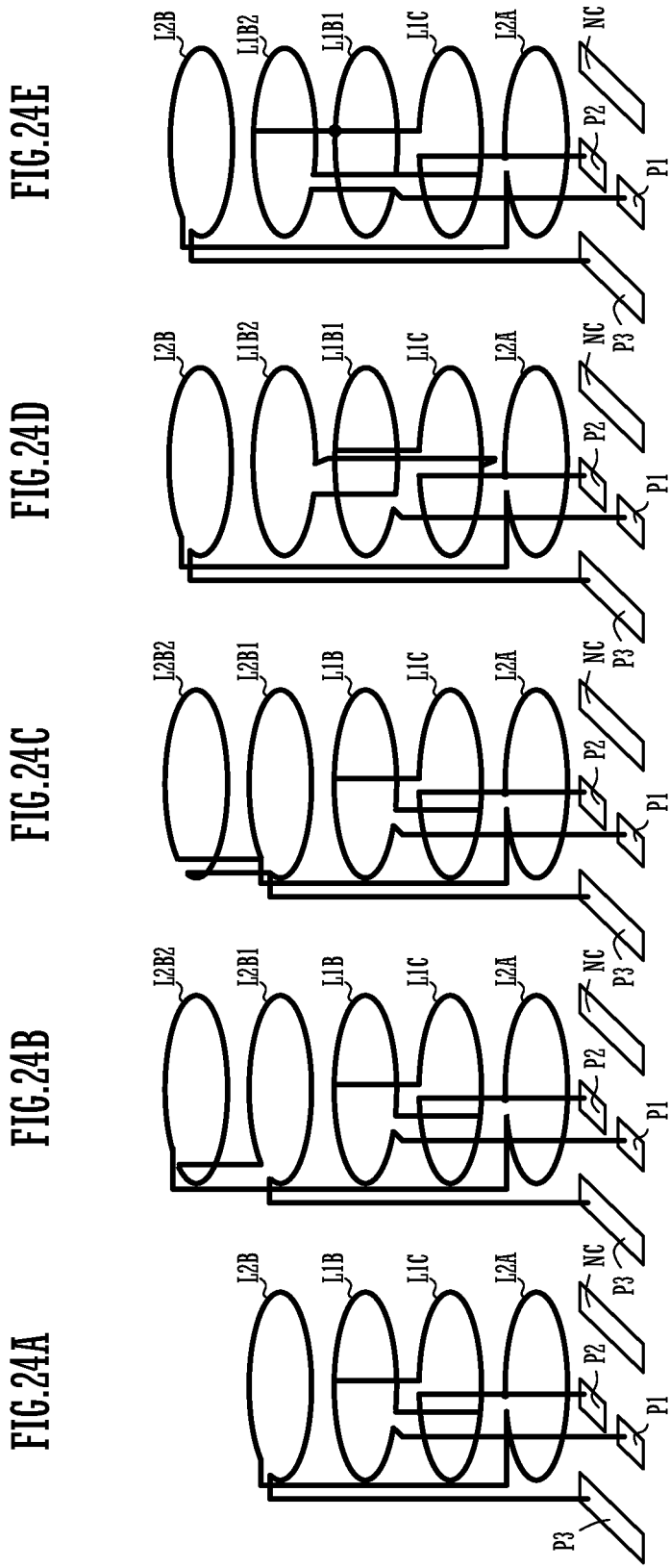
FIGS. 24A to 24E are perspective views of various kinds of conductive patterns in several impedance transformation circuits 25 according to a seventh preferred embodiment of the present invention.

FIGS. 24A to 24E are perspective views of various kinds of conductive patterns in several impedance transformation circuits 25 according to a seventh preferred embodiment of the present invention. However, a base material layer is not illustrated in the figure. In addition, a line width of each conductive pattern is not illustrated in the figure, and the conductive pattern is represented by a simplified line-shaped pattern. FIG. 24A is a perspective view illustrating an impedance transformation circuit represented as a comparative example of FIGS. 24B to 24E. The impedance transformation circuit as illustrated in FIG. 24A corresponds to the impedance transformation circuit 25 as illustrated in FIG. 7.

In FIG. 24B, conductive patterns L2B1, L2B2 are preferably provided in two layers, respectively, and the two layers are connected in series. That is, FIG. 24B is an example where a conductive pattern L2B (fourth loop-shaped conductor) of FIG. 24A is preferably provided in two layers, and the two layers are connected in series.

In FIG. 24C, the conductive patterns L2B1, L2B2 are preferably provided in two layers, respectively, and the two layers are connected in parallel. That is, FIG. 24C is an example where the conductive pattern L2B (fourth loop-shaped conductor) of FIG. 24A is preferably provided in two layers, and the two layers are connected in parallel.

In FIG. 24D, conductive patterns L1B1, L1B2 are preferably provided in two layers, respectively, and the two layers are connected in series. That is, FIG. 24D is an example where a conductive pattern L1B (first loop-shaped conductor) of FIG. 24A is preferably provided in two layers, and the two layers are connected in series.

In FIG. 24E, the conductive patterns L1B1, L1B2 are preferably provided in two layers, respectively, and the two layers are connected in parallel. That is, FIG. 24E is an example where the conductive pattern L1B (first loop-shaped conductor) of FIG. 24A is preferably provided in two layers, and the two layers are connected in parallel.

The examples of FIGS. 24A to 24E have described the example of series connection of one of the fourth loop-shaped conductor and the first loop-shaped conductor, and the example of parallel connection of one of the fourth loop-shaped conductor and the first loop-shaped conductor, but the same can also apply to the third loop-shaped conductor and the second loop-shaped.

As described above, at least any of the first loop-shaped conductor, the second loop-shaped conductor, the third loop-shaped conductor, and the fourth loop-shaped conductor may define a loop including a plurality of turns over a plurality of base material layers. In addition, at least any of the first loop-shaped conductor, the second loop-shaped conductor, the third loop-shaped conductor, and the fourth loop-shaped conductor may be provided in a plurality of base material layers, and may be connected in parallel.

Eighth Preferred Embodiment

Figure 25:
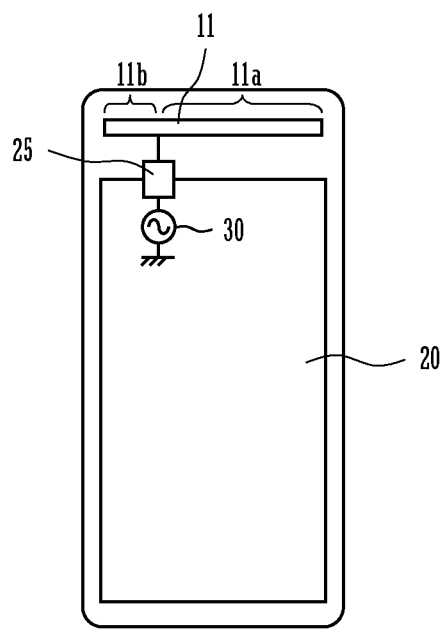
FIG. 25 is a figure illustrating a configuration of a wireless communication apparatus such as a cellular phone terminal according to an eighth preferred embodiment of the present invention.

FIG. 25 is a figure illustrating a configuration of a wireless communication apparatus such as a cellular phone terminal according to an eighth preferred embodiment of the present invention. FIG. 25 shows only main portions in a housing of the wireless communication apparatus. In the housing, an antenna element 11 and a circuit substrate are disposed. A ground conductor 20 is provided in the circuit substrate, and an impedance transformation circuit 25 and a feeder circuit 30 are disposed in the circuit substrate.

The antenna element 11 is included in a T-branch-type antenna including two radiation elements 11a, 11b connected from the feeder circuit 30. The radiation element 11a is configured to have an electrical length to resonate at about λ/4 in the Low Band (λ: wavelength in the Low Band). The radiation element 11b is configured to have an electrical length to resonate at about λ/4 in the High Band (λ: wavelength in the High Band). It is to be noted that the operation principle of this antenna is merely an example. For example, the antenna element may be designed such that, in the High Band, the entire radiation element (11a+11b) resonates at about (¾)λ, for example. In this case, the radiation element becomes large in the High Band, and therefore the radiation characteristics are improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transformer comprising:
a stacked element including a plurality of base material layers stacked on each other; and
a first coil element and a second coil element that are magnetically coupled and disposed in the stacked element; wherein
the first coil element includes a first loop-shaped conductor and a second loop-shaped conductor disposed in different layers of the stacked element, respectively;
the second coil element includes a third loop-shaped conductor and a fourth loop-shaped conductor disposed in different layers of the stacked element, respectively;
the first loop-shaped conductor, the second loop-shaped conductor, the third loop-shaped conductor, and the fourth loop-shaped conductor have a same or substantially a same shape in a top view from a stacking direction;
the first loop-shaped conductor and the second loop-shaped conductor are sandwiched in the stacking direction between the third loop-shaped conductor and the fourth loop-shaped conductor;
a portion of the first loop-shaped conductor and a portion of the second loop-shaped conductor are connected in parallel;
the portion of the first loop-shaped conductor is defined as a first parallel connecting portion and the portion of the second loop-shaped conductor is defined as a second parallel connecting portion;
a remaining portion of the first loop-shaped conductor is connected to the first and second parallel connecting portion in series and coplanar with the first parallel connecting portion;
a remaining portion of the second loop-shaped conductor is connected to the first and second parallel connecting portion in series and coplanar with the second parallel connecting portion;
the third loop-shaped conductor and the fourth loop-shaped conductor are connected in series; and
the first loop-shaped conductor and the second loop-shaped conductor are arranged adjacent to each other in the stacking direction.

2. A wireless communication apparatus comprising a wireless communication circuit including therein the transformer according to claim 1.

3. The wireless communication apparatus according to claim 2, wherein a conductive pattern connected in series with one of the third loop-shaped conductor and the fourth loop-shaped conductor is provided on a formation layer of one of the first loop-shaped conductor and the second loop-shaped conductor.

4. The wireless communication apparatus according to claim 2, wherein each of the first loop-shaped conductor, the second loop-shaped conductor, the third loop-shaped conductor, and the fourth loop-shaped conductor is loop-shaped including a single or substantially a single turn per layer.

5. The wireless communication apparatus according to claim 2, wherein at least any of the first loop-shaped conductor, the second loop-shaped conductor, the third loop-shaped conductor, and the fourth loop-shaped conductor define a loop including a plurality of turns over a plurality of base material layers.

6. The wireless communication apparatus according to claim 2, wherein at least any of the first loop-shaped conductor, the second loop-shaped conductor, the third loop-shaped conductor, and the fourth loop-shaped conductor are provided in a plurality of base material layers and are connected in parallel.

7. The wireless communication apparatus according to claim 2, wherein a plurality of sets of the first loop-shaped conductors and the second loop-shaped conductors are stacked.

8. The transformer according to claim 1, wherein a conductive pattern connected in series with one of the third loop-shaped conductor and the fourth loop-shaped conductor is provided on a formation layer of one of the first loop-shaped conductor and the second loop-shaped conductor.

9. The transformer according to claim 1, wherein each of the first loop-shaped conductor, the second loop-shaped conductor, the third loop-shaped conductor, and the fourth loop-shaped conductor is loop-shaped including a single or substantially a single turn per layer.

10. The transformer according to claim 1, wherein at least any of the first loop-shaped conductor, the second loop-shaped conductor, the third loop-shaped conductor, and the fourth loop-shaped conductor define a loop including a plurality of turns over a plurality of base material layers.

11. The transformer according to claim 1, wherein at least any of the first loop-shaped conductor, the second loop-shaped conductor, the third loop-shaped conductor, and the fourth loop-shaped conductor are provided in a plurality of base material layers and are connected in parallel.

12. The transformer according to claim 1, wherein a plurality of sets of the first loop-shaped conductors and the second loop-shaped conductors are stacked.

* * * * *